United States Patent
Schwertfeger et al.

(10) Patent No.: US 9,537,034 B2
(45) Date of Patent: Jan. 3, 2017

(54) PROCESS FOR THE PRODUCTION OF A SOLAR MODULE

(71) Applicant: tesa SE, Hamburg (DE)

(72) Inventors: Michael Schwertfeger, Hamburg (DE); Andreas Stein, Hamburg (DE)

(73) Assignee: TESA SE, Norderstedt (DE)

( * ) Notice: Subject to any disclaimer, the term of this patent is extended or adjusted under 35 U.S.C. 154(b) by 155 days.

(21) Appl. No.: 13/965,329

(22) Filed: Aug. 13, 2013

(65) Prior Publication Data

US 2015/0047695 A1 Feb. 19, 2015

(30) Foreign Application Priority Data

Aug. 13, 2012 (DE) .................. 10 2012 214 401

(51) Int. Cl.
| | |
|---|---|
| *H01L 31/048* | (2014.01) |
| *C09J 5/06* | (2006.01) |
| *C09J 7/00* | (2006.01) |
| *B32B 17/06* | (2006.01) |
| *B32B 17/10* | (2006.01) |

(52) U.S. Cl.
CPC ......... *H01L 31/0488* (2013.01); *B32B 17/061* (2013.01); *B32B 17/10036* (2013.01); *B32B 17/10697* (2013.01); *B32B 17/10935* (2013.01); *C09J 5/06* (2013.01); *C09J 7/00* (2013.01); *H01L 31/048* (2013.01); *C09J 2203/322* (2013.01); *C09J 2409/00* (2013.01); *C09J 2461/00* (2013.01); *Y02E 10/50* (2013.01)

(58) Field of Classification Search
CPC ...... F24J 22/5202; F24J 2/5204; F24J 2/5252; F24J 2/5254; F24J 2/5228; F24J 2/5211; H02S 30/10; H01L 31/048; H01L 31/0481; H01L 31/0488; H01L 31/049
USPC .................................. 156/331.1–331.5, 335
See application file for complete search history.

(56) References Cited

U.S. PATENT DOCUMENTS

| | | | | |
|---|---|---|---|---|
| 5,277,972 | A * | 1/1994 | Sakumoto | C09J 7/0246 257/E23.049 |
| 6,132,569 | A * | 10/2000 | Shiozaki | 204/192.27 |
| 6,201,179 | B1 * | 3/2001 | Dalacu | 136/244 |
| 2005/0081993 | A1 | 4/2005 | Ilkka et al. | |
| 2011/0126904 | A1 * | 6/2011 | Fang | H01L 31/049 136/259 |
| 2011/0197955 | A1 * | 8/2011 | Booth et al. | 136/251 |
| 2012/0279647 | A1 | 11/2012 | Staiger et al. | |
| 2013/0118544 | A1 * | 5/2013 | Malik | 136/244 |
| 2014/0338190 | A1 * | 11/2014 | Gao | H01L 31/18 29/825 |

FOREIGN PATENT DOCUMENTS

| | | | | |
|---|---|---|---|---|
| CN | 102956755 | * | 3/2013 | ......... H01L 31/0487 |
| DE | 10 2009 046 256 A1 | | 5/2011 | |
| DE | 10 2009 057 937 A1 | | 6/2011 | |
| DE | 10 2010 039 880 A1 | | 3/2012 | |
| WO | WO 2011/109701 A2 | | 9/2011 | |
| WO | 2012 019909 A1 | | 2/2012 | |

OTHER PUBLICATIONS

European Search Report dated Nov. 25, 2013, from corresponding European Application EP 13 17 3510.

* cited by examiner

*Primary Examiner* — Scott W Dodds

(74) *Attorney, Agent, or Firm* — Norris McLaughlin & Marcus PA

(57) ABSTRACT

The invention is to facilitate the attachment of an installation system in the production of a solar module. This is achieved via a process which comprises the following steps:
  a) mutual superposition of the layers that the structure of the solar module requires, where at least one heat-activatable double-sided adhesive tape is placed on the external side of the reverse-side layer and at least one retention plate is placed on said adhesive tape;
  b) mutual lamination of the layers mutually superposed in step a), at least with exposure to heat.

3 Claims, No Drawings

PROCESS FOR THE PRODUCTION OF A SOLAR MODULE

The present invention relates to the technical field of the solar modules that are generally used for the generation of electrical energy from sunlight. The invention proposes a novel process for the production of solar modules, which in particular facilitates the attachment of the installation system.

There is a continuing increase in the use of photovoltaic systems for the generation of electricity from renewable energy sources. Photovoltaic systems are generally composed of a plurality of solar modules electrically connected to one another. These modules are also known as photovoltaic modules or by the abbreviated term PV modules, and in turn comprise solar cells electrically connected to one another in which the energy of sunlight is converted to electrical energy.

There are various embodiments of solar cells, and these are most frequently classified as thick-layer and thin-layer cells in accordance with the thickness of the material. Thick-layer silicon cells are most widely used, either in the form of monocrystalline cells (c-Si) or in the form of multicrystalline cells (mc-Si). However, the thin-layer cells are increasingly used, often being based on amorphous silicon (a-Si), and other cells also increasingly used are organic solar cells and dye-sensitized cells.

Materials for the semiconductor cells most frequently used comprise not only the abovementioned silicon modifications but also, particularly for thin-layer cells, gallium arsenide (GaAs), cadmium telluride (CdTe), copper indium disulphide (CIS) and copper indium gallium diselenide (CIGS).

Solar cells are electrically connected in series by conductor tracks on the frontal and reverse side. A certain number of solar cells electrically connected to one another in this way then form the basis of what is known as a solar module. This type of solar module typically has the following structure.

The uppermost layer on the side facing towards the sun is composed of a sheet of glass that is resistant to temperature and impact, and to shock and pressure.

This is followed in the direction towards the side facing away from the sun by a transparent plastics layer which is generally composed of ethylene-vinyl acetate.

The third layer is then composed of the solar cells electrically connected to one another. The reverse side of the module, and therefore the outermost layer on the side facing away from the sun, is composed either of a weathering-resistant plastics foil or of another sheet of glass. The plastics foils used for this purpose are often composed of a composite material, for example made of polyvinyl fluoride and polyester.

A plurality of solar modules electrically connected to one another give a solar generator, which in combination with other devices, for example an inverter, represents a photovoltaic system which can feed electricity generated from sunlight into the grid or can provide electricity for direct use at the location of the system.

The solar modules are fixed on roofs or positioned on the ground. For this purpose, the modules usually have installation systems which provide the connection to the structures available at the usage site.

In the production process for solar modules, a distinction is generally drawn between what is known as the "front end" and what is known as the "back end". In the "front end", the module is constructed with its various layers simply by mutual superposition—optionally with use of an auxiliary fixing for assistance—and is then subjected to a lamination process. Here, the encapsulation material, which often involves an ethylene-vinyl acetate copolymer (EVA) melts and crosslinks. The lamination can proceed in one or more stages, in essence being influenced by the following parameters: pressure, temperature and time. The "front end" ends with the conclusion of the lamination process.

After passage through the front end, the solar cells have been embedded in the transparent plastics layer, which protects them from corrosion.

In the "back end" that follows, the connection socket is put in place, the module is inspected and the installation profiles are attached by adhesion. The adhesive bonding of the installation system is usually achieved by using self-adhesive tape or adhesive paste systems. This direct application of the installation system to the reverse side of the module is practised in particular on modules with a glass reverse side.

The application of supportive elements or installation elements to the reverse side of a solar module is described by way of example in WO 2011/109701 A2. According to the said specification, an installation element ("support member") is applied to that side of the solar module that faces away from the light by means of combination of a "handling adhesive" and an installation adhesive ("structural adhesive"). The installation element here is held in its position by the handling adhesive until the installation adhesive has fully hardened.

The adhesive bonding of the installation system on a solar module requires a workstation specially set up for this purpose, equipped with specific devices. The adhesive bonding process must be carried out with great precision in order to provide assured quality.

Examples of the materials required for adhesive bonding by means of self-adhesive tape are glass cleaners, various adhesion promoters for glass and installation profile, and also a double-sided adhesive tape. Additional requirements are an adhesive-tape-unwind system and/or adhesive-tape-applicator system, and also devices for positioning, and applying pressure to, profile. The process comprises inter alia the cleaning of the installation profile, the application and drying of the adhesive promoter on the profile, application of the adhesive tape, the cleaning of the glass, application and wipe-dry of the adhesion promoter on the glass, the removal of the release films from the installation profile, and the positioning of the profile and—optionally in a machine—application of pressure to attach the profile.

Adhesive bonding by means of adhesive paste systems also requires an extensive range of apparatus, for example alongside the actual single- or multicomponent adhesive system a specific mixing, metering and application unit for the adhesive system and an intermediate storage facility for the drying of the adhesive. The process must provide time for the drying and the hardening of the adhesive.

Although, therefore, both processes can be automated they require many operations, have high apparatus costs and are susceptible to error.

An object of the present invention is therefore to simplify the application of the installation system of a solar module, without any loss of quality.

The basis for achievement of the object is the fundamental idea, underlying the invention, that the step of adhesive bonding of those parts of the installation system that adhere directly on the solar module can be carried out in the context of the lamination process, before the front end is concluded.

The invention therefore firstly provides a process for the production of a solar module, comprising the following steps:
  a) mutual superposition of the layers that the structure of the solar module requires, where at least one heat-activatable double-sided adhesive tape is placed on the external side of the reverse-side layer and at least one retention plate is placed on said adhesive tape;
  b) mutual lamination of the layers mutually superposed in step a), at least with exposure to heat.

The claimed process advantageously permits omission of the complicated adhesive bonding of the installation system in the back end, and therefore represents a considerable simplification of the production process for solar modules. The positioning of the retention plate is simpler and more robust than in conventional processes in that, for example, exudation of the adhesive is avoided, cutting of the retention plate to size becomes easier, and there is an overall improvement in ease of handling of the equipment. Substantial integration of attachment of the installation system into the module-production process is moreover achieved in terms of both time and space, since the adhesive bonding of the retention plate(s) is achieved before the said process is concluded. The fixing of the actual installation system can then take place in a simple manner either directly after module production or at the construction site. The separation of retention plate from installation system moreover provides greater freedom in the selection of individual installation systems.

The expression "solar module" means a device which comprises a plurality of solar cells electrically connected to one another and which can convert sunlight into electrical energy. According to the invention, the solar module is preferably a glass-glass system, and this means that both the outermost layer on the side facing towards the sun and the outermost layer on the side facing away from the sun are composed of a glass sheet. Glass-glass modules of this type are a conventional embodiment of solar modules made of thick-layer cells. Thin-layer modules have hitherto mostly been produced via deposition of the semiconductor material onto a substrate from the gas phase. The material of the said substrate can involve glass, metal, plastic, or else any other material. Thin-layer solar modules are also increasingly being produced in the form of glass-glass systems, based on the development of thinner and less expensive glass materials.

The expression "layers that the structure of the solar module requires" means all of the elements, components, etc. which are intended to be bonded to one another in the lamination step and are therefore subjected to the lamination process. The term "layer" therefore also comprises rigid and comparatively large components such as glass sheets and retention plates.

The expression "reverse-side layer" of the solar module means the outermost solar-module layer located on the side facing away from the sun. The external side of the said layer is the side that faces away from the other layers of the solar module and that is therefore in direct contact with the material surrounding the reverse side of the module or with the atmosphere surrounding the reverse side of the module. According to the invention, the reverse-side layer is preferably a glass layer.

The expression "retention plate" means a device which can be laminated to the reverse side of the solar module and which permits the subsequent fixing of an installation system via mechanical connection of retention plate and installation system. The retention plate is preferably an aluminium plate. The shape of the retention plate should in particular be sufficiently flat to pass through the lamination process. The thickness of the retention plate is preferably at most 20 mm, more preferably at most 15 mm, in particular at most 10 mm. The expression thickness of the retention plate here means the dimension of the retention plate in a direction that is vertical with respect to the plane formed by the reverse side of the solar module.

By way of example, the retention plate can be an aluminium plate measuring 150 mm:150 mm:5 mm which has chamfered edges and M6 threaded bores for attachment of the installation system. The thickness of the retention plate in this example is 5 mm. The chamfered edges advantageously prevent damage to the delicate transport blankets in the lamination process.

The claimed process preferably comprises, as step c), attachment of an installation system for the solar module via fixing on the retention plate.

The installation system can by way of example comprise jointed-pin connectors, which at the same time minimize the force introduced into the solar module via thermal expansion of the installation system. This is important by way of example when the solar modules installed on a roof are exposed to heat. If all of the attachment points have fixed screw-thread attachment and the materials expand on exposure to heat, the module is exposed to severe forces. In such cases it is useful to combine what is known as fixed mounting and movable mounting, so that the said forces can be absorbed. The jointed-pin connectors of the installation system can provide these movable mountings.

To facilitate accurate positioning of the adhesive system and of the retention plate, it is preferable to use a template, for example in the form of a frame that is swung down onto the laminate.

The expression "heat-activatable adhesive tape" means an adhesive tape based on an adhesive which is crosslinked when thermal energy is introduced and thus provides sufficient adhesive bond strength (sufficient adhesion, sufficient cohesion) for the intended adhesive bonding. The room-temperature grab (pressure-sensitive adhesion, tack) of the adhesive or of the adhesive mass can be zero, low, or high. The activation temperatures for the thermal crosslinking process are markedly above room temperature, usually at least 80° C. or above. In particular in order to ensure that the adhesive bond strength is as required, preferred activation temperatures for the thermal crosslinking process according to the invention are at least 90° C., in particular from 95° C. to 120° C.

For the purposes of the invention, the general expression "adhesive tape" comprises all sheet-like structures such as two-dimensional films or film sections, tapes with high length and restricted width, tape sections, punched-out sections and the like.

According to the invention, mutual superposition of a plurality of heat-activatable adhesive tapes is also possible in order to achieve greater thickness of the adhesive bonding layer. Preference is given to mutual superposition of two adhesive tapes. The heat-activation produces a secure bond which advantageously has the properties of a relatively thick adhesive layer.

It is preferable that the heat-activatable adhesive tape of step a) of the claimed process comprises an adhesive mass which comprises at least one nitrile rubber and at least one phenolic resin. It is preferable that the total content of nitrile rubber in the adhesive mass is from 30 to 80% by weight, particularly from 40 to 70% by weight, based on the total weight of the adhesive mass. The total content of phenolic resins in the adhesive mass is preferably from 20 to 70% by weight, particularly preferably from 30 to 60% by weight, based on the total weight of the adhesive mass. In particular, the ratio by weight of the total amount of nitrile rubber to the total amount of phenolic resins in the adhesive mass is from 1.3:1 to 0.7:1, very particularly preferably from 1.1:1 to 0.9:1, for example from 1.05:1 to 0.95:1.

The expression "nitrile rubber" means a polymer which is obtained via copolymerization of acrylonitrile and butadiene, and optionally also of isoprene. It is preferable that the proportion by weight of acrylonitrile in a polymer of this type is from 15 to 70% by weight, particularly from 20 to 60% by weight, in particular from 30 to 55% by weight. As already described above, another possibility is use of copolymers of acrylonitrile-butadiene and isoprene.

The expression "phenolic resins" means synthetic resins which are obtained via condensation of phenols with aldehydes, in particular with formaldehyde, via derivatization of the resulting condensates or via addition reaction of phenols onto unsaturated compounds, such as acetylene, terpenes or natural resins. Phenolic resins can be divided into two groups, firstly the resols, which are produced when the production process uses an excess of formaldehyde, and secondly the novolaks, which are formed when the amount of formaldehyde used is substoichiometric. Resols self-crosslink spontaneously on exposure to heat or on addition of acid, with elimination of water, whereas reaction between novolaks occurs only if a formaldehyde source acts as crosslinking agent. It crosslinks without elimination of water.

In an advantageous procedure for increasing adhesion, it is possible to add, to the adhesive mass, tackifier resins ("tackifiers") that are compatible with the elastomers.

Examples of tackifiers that can be used in the adhesive mass of the heat-activatable adhesive tape are colophony-based and colophony-derivative-based non-hydrogenated or partially or fully hydrogenated resins, hydrogenated polymers of dicyclopentadiene, non-hydrogenated or partially, selectively or fully hydrogenated hydrocarbon resins based on $C_5$-, $C_5/C_9$- or $C_9$-monomer streams, polyterpene resins based on α-pinene and/or β-pinene and/or δ-limonene, and hydrogenated polymers of preferably pure $C_8$- and $C_9$-aromatics. The abovementioned tackifier resins can be used either alone or else in a mixture. Tackifier content present in the blended adhesive mass can advantageously be up to 20% by weight, based on the said adhesive mass.

It is also possible to use small amounts of epoxy resins. For retention of shelf life, the amount of epoxy resin preferably does not exceed 10% by weight.

The expression "epoxy resins" means either monomers or else oligomeric compounds having more than one epoxy group per molecule. These can be reaction products of glycidic esters or epichlorohydrin with bisphenol A or bisphenol F or a mixture of both of these. It is equally possible to use epoxy novolak resins obtained via reaction of epichlorohydrin with the reaction product of phenols and formaldehyde. It is also possible to use monomeric compounds having a plurality of terminal epoxy groups, these being used as diluents for epoxy resins. Epoxy resins modified to have elastic properties can likewise be used.

The following can optionally be used as other additives:
primary antioxidants, for example sterically hindered phenols;
secondary antioxidants, for example phosphites or thioethers;
other antioxidants, such as sterically hindered amines;
process stabilizers, for example carbon-free-radical scavengers;
light stabilizers, for example UV absorbers;
processing aids;
fillers, for example silicon dioxide, glass (ground or in the form of beads), aluminium oxides, zinc oxides, titanium dioxides, carbon blacks, metal powders, etc.;
colour pigments and dyes, and also optical brighteners;
optionally other polymers preferably of elastomeric type.

The abovementioned additives, and optionally other additives, can be used alone or in combination with one another.

The adhesive mass can also comprise one or more plasticizers. Use of plasticizers can increase the elasticity of the crosslinked adhesive mass. Examples of plasticizers that can be used here are low-molecular-weight polyisoprenes, polybutadienes, polyisobutylenes or polyethylene glycols and/or polypropylene glycols.

To produce the adhesive tape, the constituents of the adhesive mass are in particular dissolved or suspended in a suitable solvent, for example butanone, coated onto a flexible substrate provided with a release layer (for example a release paper or a release film), and dried, so that the mass can in turn easily be removed from the substrate. Punched-out sections, rolls or other forms of product can be produced at room temperature after appropriate further processing.

The heat-activatable adhesive tapes used according to the invention can have a protective covering material (release liner; liner), for example using siliconized paper, siliconized polymer film (for example siliconized PET film) or the like.

According to the invention, it is possible to pretreat the areas that the heat-activatable adhesive tape(s) is/are intended to bond. This pretreatment comprises not only physical but also chemical methods. In particular, the external side of the reverse-side layer of the solar module may be provided with a primer, for example with a primer for glass. The "placing of at least one heat-activatable double-sided adhesive tape on the external side of the reverse-side layer of the solar module" provided in the context of the claimed process expressly also comprises the placing of the adhesive tape on a primer-pretreated external side of the reverse-side layer of the solar module. To the extent that the reverse-side layer of the solar module is a glass sheet or a glass layer, this can also be a primer-treated glass sheet or a primer-treated glass layer.

The invention further provides a solar module which is obtainable by the claimed process.

The invention further provides the use of a heat-activatable double-sided adhesive tape in lamination processes of the production of solar modules. It is preferable that the heat-activatable double-sided adhesive tape is used for the attachment of a retention plate or an installation system.

EXAMPLES

Test samples were produced via adhesive bonding of aluminium plates to glass sheets by means of a heat-activatable adhesive tape. The following materials were used here:
Glass sheets: single-sheet safety glass, 19.5×37 cm, with a thickness 3 mm and, respectively, 2.5×10 cm with a thickness 6 mm
Aluminium plates: aluminium strips, 7.5×2.5 cm, with a thickness 3 mm
Adhesive tape: Tesa® HAF 8402; Tesa® HAF 8400

The adhesive tapes here were used in single-ply form (one adhesive tape) or in double-ply form (two adhesive tapes mutually superposed).

Test samples were produced with an adhesive bonding area of in each case 2.5×2.5 cm via mutual superposition of the glass sheet, of the adhesive tape(s) and of the aluminium plate, followed by mutual lamination at 150° C. and 1 bar for 90 s. These lamination parameters correspond to conventional conditions for the production of solar modules.

The samples were then conditioned in accordance with the EN 61215:2005 humidity-freeze test known in the solar industry. In the humidity-freeze test the test samples are first heated from room temperature to 85° C. and held at this temperature at 85% relative humidity for 20 h. They are then cooled to −40° C. (once room temperature has been reached without regulation of humidity), and each test sample is kept at this temperature for at least 30 min. It is then heated again up to 85° C. (once room temperature is reached again at 85% relative humidity), and the cycle is repeated. The maximum time permitted to expire from the beginning of the cooling process until the temperature of 85° C. is again reached is 4 h. The total number of cycles provided in the test is ten.

In order to study adhesive bond strength, the samples were subjected, after the conditioning process, to a dynamic shear test in a Zwick tensile tester. Here, the test specimens were subjected to tensile strain with a velocity of 10 mm/min in the y-direction, and the maximum force measured during this process was stated as result. Table 1 shows the test results.

TABLE 1

| No. | Thickness of glass | Adhesive tape | Strength (N/cm$^2$) | Nature of break |
|---|---|---|---|---|
| 1 | 3 mm | tesa ® HAF 8400 single-ply | 1114 | glass break |
| 2 | 3 mm | tesa ® HAF 8400 double-ply | 1170 | aluminium break |
| 3 | 6 mm | tesa ® HAF 8402 single-ply | 1118 | glass break |
| 4 | 6 mm | tesa ® HAF 8400 single-ply | 994 | glass break |
| 5 | 6 mm | tesa ® HAF 8400 double-ply | 861 | glass break |

As shown by the test results, heat-activatable adhesive tapes achieve excellent shear strengths in adhesive bonds of the materials usually used for solar modules, under conditions that are usual in solar module production. The process-technology advantages of the claimed method are thus available for the intended use.

The invention claimed is:

1. A process for the production of a solar module, comprising the following steps:
   a) mutual superposition of the layers that the structure of the solar module requires, and placing at least one heat-activatable double-sided adhesive tape on an external side of a reverse-side layer and placing at least one retention plate on said adhesive tape; and
   b) mutual laminating of the layers mutually superposed in step a), at least with exposing to heat,
   wherein the heat-activatable adhesive tape comprises an adhesive mass which comprises (i) at least one nitrile rubber present at 30 to 80% by weight, and (ii) at least one phenolic resin present at 15 to 70% by weight.

2. The process according to claim 1, wherein the reverse-side layer is a glass layer.

3. The process according to claim 1, wherein the solar module is a glass-glass system.

* * * * *